(12) United States Patent
Neuberger et al.

(10) Patent No.: US 11,077,808 B2
(45) Date of Patent: Aug. 3, 2021

(54) CIRCUIT ASSEMBLAGE FOR CARRYING OUT A COMPARISON

(71) Applicant: Robert Bosch GmbH, Stuttgart (DE)

(72) Inventors: Martin Neuberger, Elsenfeld (DE); Christian Bohne, Stuttgart (DE); Oliver Dieter Koller, Weinstadt (DE)

(73) Assignee: Robert Bosch GmbH, Stuttgart (DE)

( * ) Notice: Subject to any disclaimer, the term of this patent is extended or adjusted under 35 U.S.C. 154(b) by 139 days.

(21) Appl. No.: 16/483,793

(22) PCT Filed: Feb. 2, 2018

(86) PCT No.: PCT/EP2018/052628
§ 371 (c)(1),
(2) Date: Aug. 6, 2019

(87) PCT Pub. No.: WO2018/149663
PCT Pub. Date: Aug. 23, 2018

(65) Prior Publication Data
US 2019/0389405 A1    Dec. 26, 2019

(30) Foreign Application Priority Data

Feb. 14, 2017    (DE) .......................... 102017202295.7

(51) Int. Cl.
*B60R 16/03*    (2006.01)
*G01R 19/165*    (2006.01)
(Continued)

(52) U.S. Cl.
CPC ............ *B60R 16/03* (2013.01); *B60R 16/023* (2013.01); *B60R 16/04* (2013.01); *G01R 19/16576* (2013.01); *B60R 2021/01156* (2013.01)

(58) Field of Classification Search
CPC ....... B60R 16/023; B60R 16/03; B60R 16/04; B60R 2021/01156; G01R 19/165;
(Continued)

(56) References Cited

U.S. PATENT DOCUMENTS 3,303,493 A * 2/1967 Charbonnier ............ H03K 5/24
                                                341/169
4,340,881 A * 7/1982 Stack .................... H03M 1/124
                                                341/116
(Continued)

FOREIGN PATENT DOCUMENTS

| DE | 102009053691 A1 | 5/2011 |
| EP | 0342401 A2 | 11/1989 |
| WO | 03049970 A1 | 6/2003 |

OTHER PUBLICATIONS

International Search Report for PCT/EP2018/052628, dated Apr. 11, 2018.

*Primary Examiner* — Levi Gannon
(74) *Attorney, Agent, or Firm* — Norton Rose Fulbright US LLP; Gerard Messina (57) ABSTRACT

A circuit assemblage for carrying out a comparison between a first signal and a second signal in consideration of a reference signal, the circuit assemblage encompassing: a first channel in which the first signal is processed; and a second channel in which the second signal is processed, a first differential amplifier, which obtains a first difference between the first signal and the reference signal, and a first unit for obtaining an absolute value, which obtains a first absolute value from the first difference, being provided in the first channel, and a second differential amplifier, which obtains a second difference between the second signal and the reference signal, and a second unit for obtaining an absolute value, which obtains a second absolute value from the second difference, being provided in the second channel;

(Continued)

and a comparator that compares the first absolute value with the second absolute value.

13 Claims, 6 Drawing Sheets (51) Int. Cl.
*B60R 16/023* (2006.01)
*B60R 16/04* (2006.01)
*B60R 21/01* (2006.01)

(58) Field of Classification Search
CPC ........ G01R 19/16566; G01R 19/16576; H03K 5/22; H03K 5/24; H03K 5/2418; H03K 5/2445; H03K 5/2463; H03K 5/2481
See application file for complete search history.

(56) References Cited

U.S. PATENT DOCUMENTS

| | | | | |
|---|---|---|---|---|
| 4,358,673 A | * | 11/1982 | Wittenberger | G01C 3/08 250/204 |
| 4,358,674 A | * | 11/1982 | Frazier | G02B 7/30 250/204 |
| 6,646,961 B1 | * | 11/2003 | Iida | G11B 7/00745 369/30.13 |
| 2002/0145895 A1 | * | 10/2002 | Liu | H02J 1/102 363/65 |
| 2003/0122669 A1 | * | 7/2003 | Filippov | B60R 21/01532 340/563 |
| 2012/0292984 A1 | | 11/2012 | Iwagami et al. | |

* cited by examiner

CIRCUIT ASSEMBLAGE FOR CARRYING OUT A COMPARISON

FIELD

The present invention relates to a circuit assemblage for carrying out a comparison, and to a method for carrying out a comparison, which method is carried out in particular in a vehicle electrical system of a motor vehicle.

BACKGROUND INFORMATION

A "vehicle electrical system" is to be understood, in particular in an automotive context, as the totality of all electrical components in a motor vehicle. Both electrical loads and power sources, for example generators or electrical reservoirs, for example batteries, are therefore encompassed thereby. In a motor vehicle, care must be taken that electrical energy is available in such a way that the motor vehicle can be started at any time, and that sufficient electrical power is ensured during operation. Electrical loads should still be operable for a reasonable period of time even in the shut-off state, however, with no negative effect on subsequent starting.

It is noteworthy that requirements in terms of the reliability of electrical energy supply in a motor vehicle are constantly increasing because of the increasing electrification of accessories and the introduction of new driving functions. A further consideration is that in the future, in a context of highly automated driving, activities unrelated to driving are to be permitted to a limited degree. In such a case, a fallback level provided by the driver in terms of sensing, control engineering, mechanics, and energy is present only to a limited extent. Electrical power supply in a context of highly automated, or fully automated or autonomous, driving is therefore safety-relevant to a degree not hitherto known in motor vehicles. Faults in the vehicle electrical system must therefore be recognized reliably and as completely as possible.

"Highly automatic" driving, also referred to as "highly automated" driving, is to be understood as an intermediate step between assisted driving, in which the driver is assisted by assistance systems, and autonomous driving, in which the vehicle drives itself with no intervention by the driver. In highly automatic driving the vehicle has its own intelligence, which plans ahead and could take on the driving function at least in most driving situations. The electrical power supply system therefore has a very high level of safety relevance in highly automatic driving. The energy supply system, and electrical loads, can therefore be implemented redundantly. It is not always possible, however, to provide all loads in duplicate. Only a single airbag can be provided in the steering wheel, for example. It might therefore be useful to supply power from two redundant energy sources.

German Patent Application No. DE 10 2009 053 691 A1 describes a vehicle electrical system as well as a method and an apparatus for operating the vehicle electrical system. The vehicle electrical system encompasses a DC voltage converter and a baseline energy reservoir that is coupled to the DC voltage converter. The vehicle electrical system furthermore encompasses a first selection of at least one first electrical load which is couplable electrically in parallel with the DC voltage converter, and a second selection of at least one electrical load which is coupled electrically in parallel with the baseline energy reservoir.

One of the tasks arising in multi-channel vehicle electrical systems is that of being able to reliably supply power to loads, in particular to safety-relevant loads. The known approaches according to the existing art have the disadvantage that the two electrical systems can become coupled in the event of a single fault.

SUMMARY

In accordance with the present invention, example embodiments of a circuit assemblage and a method are provided. The example embodiments are described herein.

The circuit assemblage that is described serves to carry out a comparison between two variables or signals. The comparison is carried out in consideration of a reference variable or reference signal. This means that the two signals are assessed in terms of that reference signal. That one of the two signals which is closer to the reference signal can be determined. The circuit arrangement is utilized in particular in a vehicle electrical system of a motor vehicle. The objective is to select, for power-supplying purposes, that vehicle electrical system channel which is closer to the optimum supply voltage of a component. The reference signal corresponds to the optimum supply voltage of a component.

In an embodiment, the example method permits activation of a coupling element that combines self-locking and self-conducting power semiconductors in such a way that a fail-safe state exists for a channel of the vehicle electrical system. For that purpose, the provided circuit assemblage is used to carry out a comparison.

In the context of the example method, the shared circuit design of the activation logic is furthermore provided with an inverse effect on the two or four switches of the power supply channels.

Also provided is a hardware-based mutual interlock system for the two power supply channels, in order to avoid simultaneous switching of the two channels. Intelligent selection of the channel that is to supply power is ensured by a "fast switching" analog logic. Internal monitoring of this logic circuit is also furnished in order to ensure a fail-safe state.

The problem of "toggling" between two power supply channels is eliminated by an integrated analog circuit. In addition, at least one of at least two power supply channels can be furnished in the event of a fault. The circuit configuration furthermore prevents the two channels from being coupled to one another in the event of a fault. Efficient powering of the loads, and thus operation at the working point, can thereby be ensured. Taking the concrete example of an airbag, this means that it can be supplied with electrical energy even if one or the other power supply channel has failed.

Further advantages and embodiments of the present invention are evident from the description herein and from the figures.

It is understood that the features described above and those yet to be explained below are usable not only in the respective combination indicated but also in other combinations or in isolation, without departing from the scope of the present invention.

DETAILED DESCRIPTION OF EXAMPLE EMBODIMENTS

The present invention is schematically depicted in the drawings on the basis of embodiments, and is described in detail below with reference to the figures.

Figure 1:
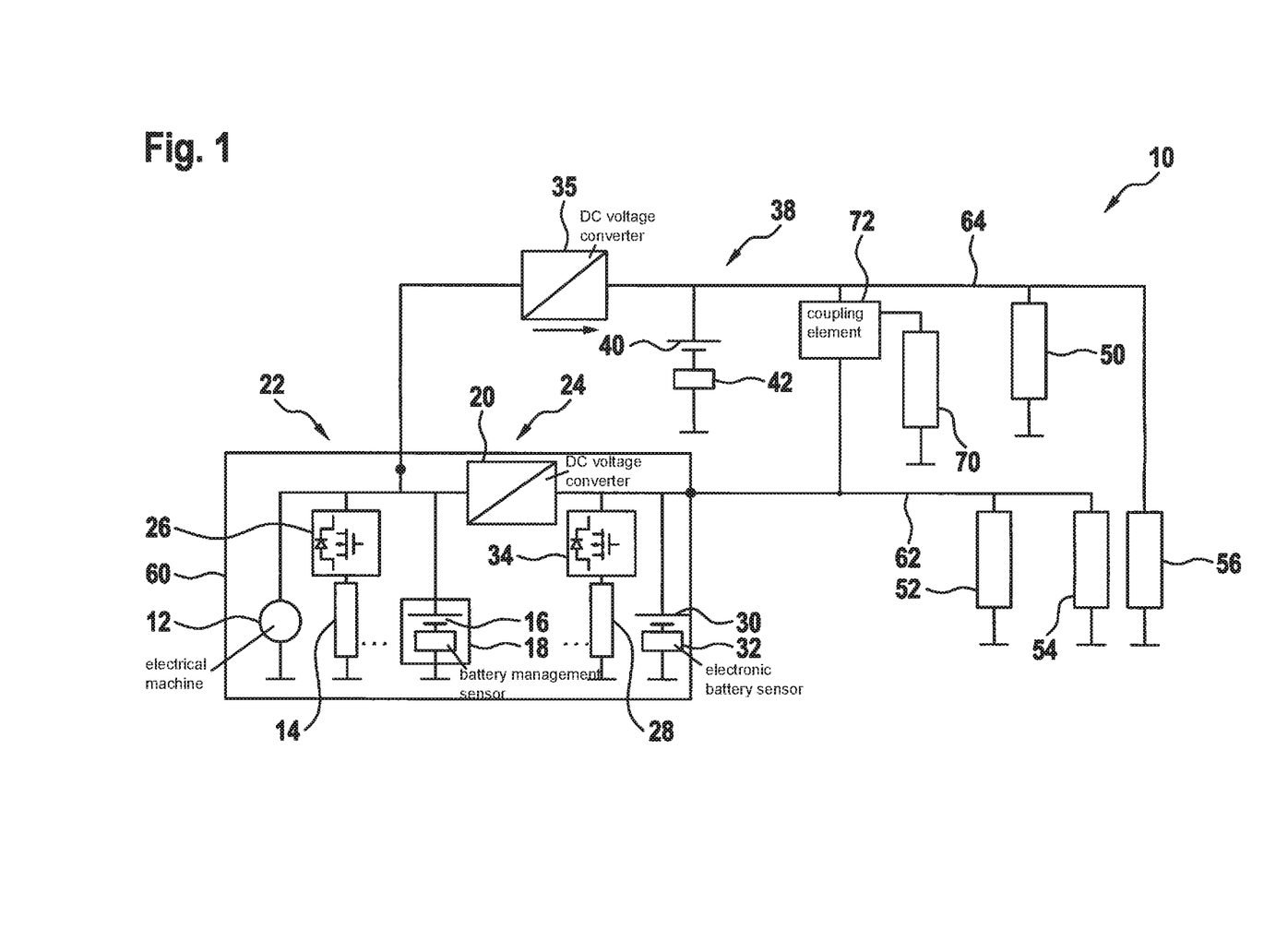
FIG. 1 shows a two-channel vehicle electrical system according to the related art.

FIG. 1 shows a possible embodiment of a two-channel vehicle electrical system according to the related art, which is labeled overall with the reference number 10. It encompasses an electrical machine 12, for example a starter; a first load 14 that is not safety-relevant; a first battery 16 that has a battery management system 18 associated with it; a DC voltage converter 20 that serves as a coupling element between a high-voltage side 22, e.g. having a voltage level of 48 V, and a low-voltage side 24, e.g. having a voltage level of 14 V; a first electronic power distribution unit (ePDU) 26; a second load 28 that is not safety-relevant; a second battery 30 having an associated electronic battery sensor 32; a second ePDU 34; a second DC voltage converter 35 that serves as a coupling element between the high-voltage side 22 and a further low-voltage side 38, e.g. also having a voltage level of 14 V; a third battery 40 having an associated electronic battery sensor 42; a first safety-relevant load 50; a second safety-relevant load 52; a third safety-relevant load 54; and a fourth safety-relevant load 56. Third safety-relevant load 54 and fourth safety-relevant load 56 are mutually redundant.

Basic vehicle electrical system 60, having high-voltage components and 14-V components having no safety relevance, is identified by a border. Contained within this basic vehicle electrical system 60 are first battery 16 and second battery 30, one having high voltage (HV), namely first battery 16, and one low voltage (LV), namely second battery 30.

A safety-relevant vehicle electrical system channel 62, having safety-relevant loads 52, 54, 56 (for example brakes, steering, etc.) is coupled to basic vehicle electrical system 60. A second safety-relevant channel 64 is also provided. Since this too supplies 14 V to safety-relevant loads 50 and 56, second DC voltage converter 35 and second battery 40 are provided.

A further safety-relevant load 70 is present only once, but can also be redundantly supplied with power from one of the two vehicle electrical system channels 62 and 64 selectably via a coupling element 72. The proposed circuit assemblage for carrying out a comparison can be used in this coupling element 72 in combination with switches.

Figure 2:
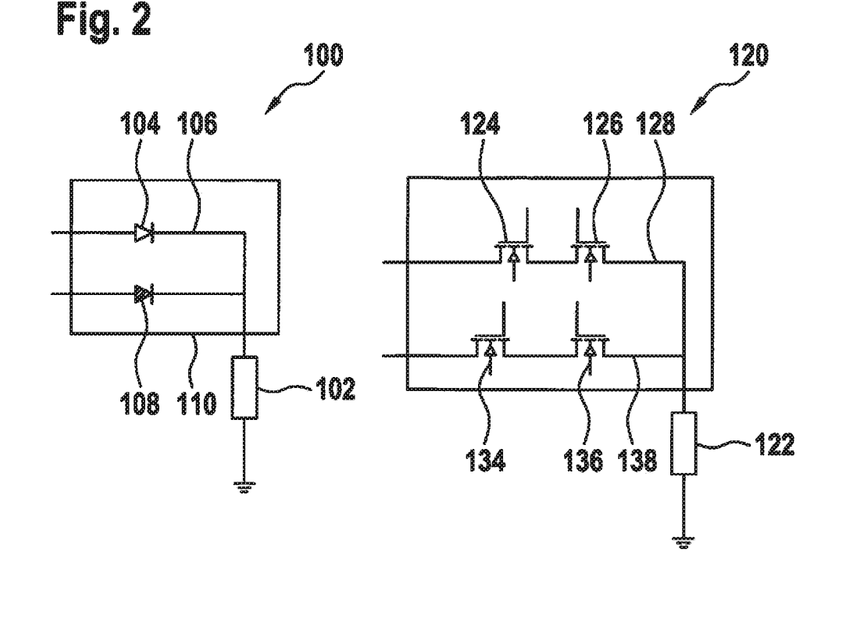
FIG. 2 shows a circuit assemblage for supplying power to a load, according to the related art.

A variety of approaches are conventional for this coupling element, which implements a changeover switch. FIG. 2 reproduces two approaches.

FIG. 2 shows, on the left side, a first circuit assemblage 100 that implements a coupling element and activates a load 102. Circuit assemblage 100 encompasses a first diode 104 in a first vehicle electrical system channel 106 and a second diode 108 in a second vehicle electrical system channel 110.

A second circuit assemblage 120, which implements a coupling element and activates a load 122, is shown on the right side. Circuit assemblage 120 encompasses a first switch 124 and a second switch 126 that are disposed in a first vehicle electrical system channel 128, as well as a third switch 134 and a fourth switch 136 that are disposed in a second vehicle electrical system channel 138. Switches 124, 126, 134, 136 can be embodied as MOSFETs.

In first circuit assemblage 100, the coupling element to load 102 is thus embodied via diodes 104, 108. Load 102 is supplied with power from first vehicle electrical system channel 106 or second vehicle electrical system channel 110, depending on which voltage is higher. This has the disadvantage that load 102 can no longer be operated in the event of overvoltage in one of vehicle electrical system channels 106 or 110. The shutoff threshold for overvoltage is to be considered in this context. On the other hand, diodes 104, 108 have the advantage that active control is not needed. In addition, in the event of undervoltage in one of vehicle electrical system channels 106 or 110, load 102 is supplied with power uninterruptedly from the other vehicle electrical system channel 106 or 110.

In second circuit assemblage 120, two switches, for example power semiconductors, are arranged counterdirectionally in each vehicle electrical system channel 128, 138. This is referred to as "back-to-back" interconnection. Depending on the vehicle electrical system channel 128 or 138 through which load 122 is to be supplied with power, either first switch 124 and second switch 126, or third switch 134 and fourth switch 136, are activated and thereby closed.

This approach has a number of disadvantages:

1) In the event of a failure of the activation logic of the coupling element, load 122 will be disconnected from both vehicle electrical systems 128 and 138, since the power semiconductors open when unenergized.

2) Incorrect control applications can cause first vehicle electrical system channel 128 and second vehicle electrical system channel 138 to be improperly connected.

The conventional approaches have the disadvantage that the two vehicle electrical systems can become coupled in the event of a single fault. For example, if one of diodes 104 in first circuit assemblage 100 fails, i.e., becomes continuously conductive, that fact cannot be detected. In the event of an overvoltage in another channel having diode 108, this would cause crosstalk onto the first channel, since diode 104 is (undetectedly) conductive. In addition, in the event of a short circuit to ground in load 102, the latter cannot be disconnected from the first channel or from the second channel. The result is that in any case, both channels are negatively affected by the short circuit.

Second circuit assemblage 120 has the disadvantage that the control system of the coupling element, which is created from circuit assemblage 120, must actively close two switches in order to supply power to load 122. In the event of a failure of the control system, load 122 can no longer be supplied with power. At the same time, in the event of failure of one channel, it is necessary to ensure a switchover to the other, still-functioning channel quickly enough to supply power to load 122 without interruption. A further disadvantage of the embodiment is that the two channels can become coupled to one another due to incorrect activations of the switches. This should, however, be prevented in all instances.

It is now proposed to combine a normally-closed switch and a normally-open switch with one another in one coupling element, in such a way that the advantages of diodes and a back-to-back approach are combined and the disadvantages are eliminated. A normally-closed switch interrupts the current flow when activated. The normally-open switch closes the contact when activated.

Figure 3:
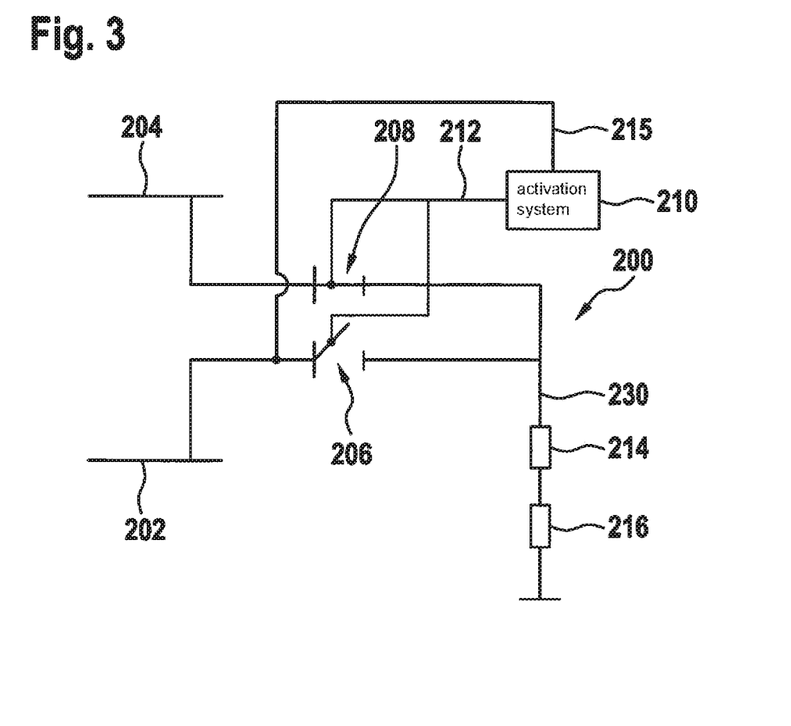
FIG. 3 shows an example embodiment of a coupling element in accordance with the present invention.

FIG. 3 shows an example embodiment of a switching element that is labeled overall with the reference number 200. The Figure shows a first vehicle electrical system channel 202, a second vehicle electrical system channel 204, a switch S1 206, a switch S2 208, an activation system 210 that outputs an activation signal $O_1$ 212, a fuse 214, and a load 216 that is to be supplied with power and is safety-relevant. Load 216 is activated, i.e. supplied with power from one of the two vehicle electrical system channels 202 or 204, via switches S1 206 and S2 208.

Switching element 200 that is shown, which encompasses substantially switches S1 206 and S2 208 as well as activation system 210, together with a logic system (not depicted here) that can be constituted by a circuit assemblage described herein for carrying out a comparison, form a coupling element that can be used, for example, for the coupling element labeled with the reference number 72 in FIG. 1.

Activation occurs as follows:

| $O_1$ | S1 | S2 |
|---|---|---|
| 0 | open | closed |
| 1 | closed | open |

Switch S1 206 is made up of a normally-closed switch, and switch S2 208 of a normally-open switch. As described previously, in one embodiment normally-closed and normally-open switches can be realized with the aid of power semiconductors, for example as self-locking and self-conducting MOSFETs. Both are switched by the same activation signal $O_1$ 212. This ensures that only one switch 206 or 208 at a time can be closed.

If the signal $O_1$=zero/false, switch S1 206 is then open and switch S2 208 is closed. Load 216 is then supplied with power via second vehicle electrical system channel 204.

If the signal $O_1$=1/true, load 216 is then supplied with power from first vehicle electrical system channel 202. The two switches 206, 208, which are embodied e.g. as power semiconductors, can be combined with fuse 214 which is embodied, for example, as a blowout fuse. The latter can be connected to load 216 in a power supply line 230, and ensures that in the event of a short circuit in load 216, the latter becomes disconnected from both vehicle electrical system channels 202, 204. Alternatively, for reasons of current capacity, several normally-closed or normally-open switches, typically power semiconductors of the same type, can alternatively be connected in parallel in both vehicle electrical system channels 202, 204. A serial disposition of several normally-closed and normally-open switches of the same type is likewise possible. Switches S1 206 and S2 208 thus represent a group of respectively normally-closed and normally-open switches of the same type, which can be disposed in any quantity in parallel or serial fashion.

In this embodiment, activation system 210 is supplied with power via a lead 215 from first vehicle electrical system channel 202. In the event of a failure of first vehicle electrical system channel 202, and thus an activation failure, switch S2 208 (constituting a normally-open switch) remains closed and thus ensures a supply of power from second vehicle electrical system channel 204.

It is also noteworthy that switch element 200 that is shown can also be disposed in a vehicle electrical system having more than two channels. In such a case, normally-open and normally-closed switches would need to be disposed in the vehicle electrical system channels so as to ensure that one vehicle electrical system channel always supplies power to the load.

The embodiment depicted has the advantage that there can be no incorrect activation which causes first channel 202 and second 204 to be capable of coupling to one another. In the event of an over- or undervoltage in one of vehicle electrical system channels 202 or 204, it is possible to switch over to the respective other one. If activation system 210 fails, switch S2 208 automatically closes and switch S1 206 automatically opens. Load 216 is then supplied with power from second vehicle electrical system channel 204.

In a further embodiment, a respective fuse, for example a blowout fuse, is installed directly after switch S1 and S2 and before the connecting point of the two vehicle electrical system channels. This has the advantage that in the event of a short circuit in one of the leads to S1 or S2, the load can continue to be supplied with power by the respective other vehicle electrical system channel.

Figure 4:
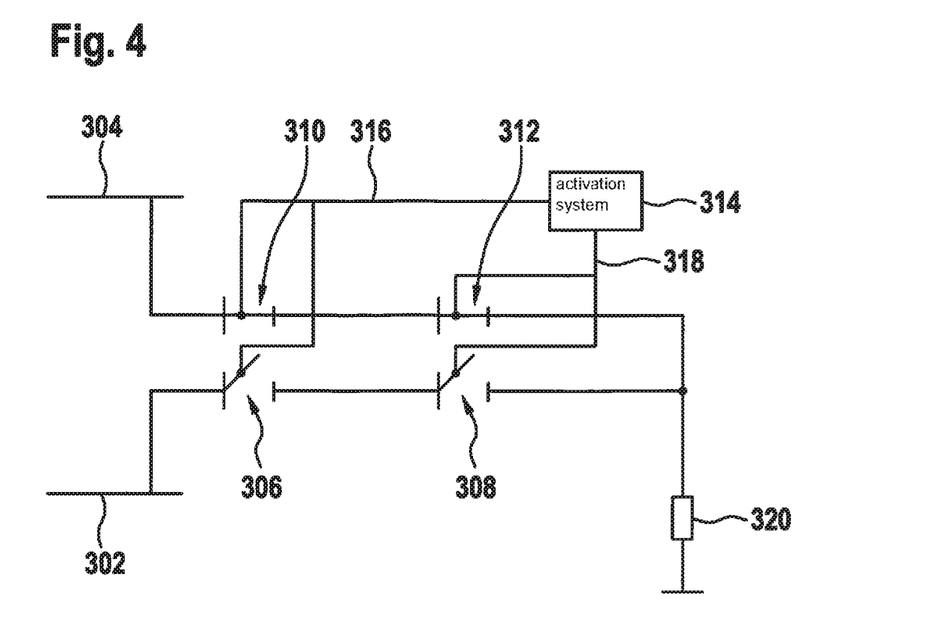
FIG. 4 shows a further embodiment of the coupling element in accordance with the present invention.

FIG. 4 shows a further embodiment of a switch element which is labeled overall with the reference number 300. The Figure shows a first vehicle electrical system channel 302, a second vehicle electrical system channel 304, a switch S1 306, a switch S3 308, a switch S2 310, a switch S4 312, an activation system 314 that outputs an activation signal $O_1$ 216 and an activation signal $O_2$ 318, and a load 320 that is to be supplied with power and is safety-relevant. The combination of switches S1 306, S3 308, S2 310, and S4 312 is activated by activation system 314. Switch element 300, which encompasses substantially switches S1 306, S3 308, S2 310, and S4 312 as well as activation system 314, forms, together with a logic system that can be constituted by a circuit assemblage for carrying out a comparison of the kind described herein, a coupling element that can be used, for example, for the coupling element labeled with the reference number 72 in FIG. 1.

The activation pattern is as follows:

| $O_1$ | $O_2$ | S1 | S2 | S3 | S4 | Load |
|---|---|---|---|---|---|---|
| 0 | 0 | open | closed | open | closed | from second channel |
| 1 | 0 | closed | open | open | closed | disconnected |
| 0 | 1 | open | closed | closed | open | disconnected |
| 1 | 1 | closed | open | closed | open | from first channel |

Two self-conducting switches (S2 and S4) and two self-locking switches (S1 and S3) are therefore combined using the same layout as shown in FIG. 3. Two separate activation signals $O_1$ 316 and $O_2$ 318, constituting output signals of activation system 314, are available for activating the switches. If both activation signals 316, 318 are equal to zero, load 320 is then supplied with power from second vehicle electrical system channel 304. If both output signals are equal to 1, load 320 is then supplied with power from first vehicle electrical system channel 302.

In the event of a short circuit in load 320 or in the leads to load 320, output signals $O_1$ 316 and $O_2$ 318 will be outputted differently. The result is that in each vehicle electrical system channel 302, 304, one switch is closed and the other in the same vehicle electrical system channel 302, 304 is opened. Load 320 can thereby be disconnected from both vehicle electrical system channels 302, 304.

This embodiment as well has the advantage that even in the event of incorrect activation, the two vehicle electrical system channels 302, 304 can never become coupled to one another. Even in the event of a failure of activation system 314, load 320 will automatically be supplied with power from second vehicle electrical system channel 304 by way of the self-conducting switches. It may be useful to dispose the switches counterdirectionally, i.e. back-to-back, in order to rule out conduction through a parasitic diode.

In a further embodiment, the normally-open switches are disposed in the first vehicle electrical system channel, and the normally-closed switches in the second vehicle electrical system channel. The result is that, in the event of failure of the activation system, the load is automatically supplied with power from the first vehicle electrical system channel. As in the embodiment of FIG. 3, it is the case here as well that in an embodiment, the normally-closed and normally-open switches are implemented with the aid of power semiconductors, for example self-locking and self-conducting MOSFETs.

A serial disposition of several normally-closed and normally-open switches of the same type is also possible in the case of circuit element 300 of FIG. 4. Switches S1, S2, S3, and S4 thus represent a group of normally-closed and normally-open switches of the same type which can be disposed in parallel or serial fashion in any quantity.

The number n of normally-closed switches in a vehicle electrical system channel corresponds to the number n of normally-open switches in the other vehicle electrical system channel. In such a case n activation signals are also furnished, each of which activates a normally-closed and a normally-open switch together.

A feature shared by all embodiments is that the respectively symmetrically mirrored variant of the changeover switch, i.e., the fact that the normally-open and normally-closed switches from the first vehicle electrical system channel are shifted into the second vehicle electrical system channel and vice versa, is likewise a possible embodiment.

Switches S1 to S4 can be implemented by suitable power semiconductors that can be, for example, p-channel or n-channel MOSFETs. Counterdirectional use of normally-closed and normally-open switches and a common activation lead, which results in inverted behavior, are of significance.

In a further embodiment, the switch element or coupling element is used in order to supply power, for example, to a voltage converter both from the output side and from the input side. This has the advantage that the converter can continue to remain active even in the event of a failure, for example under- or overvoltage, in one of the vehicle electrical system channels.

Figure 5:
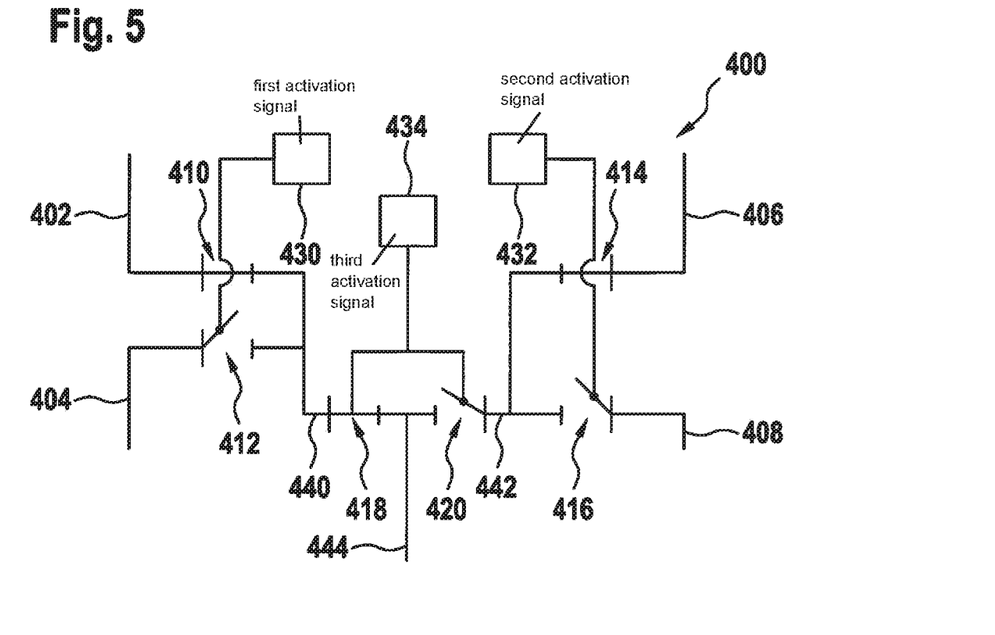
FIG. 5 shows yet another embodiment of the coupling element in accordance with the present invention.

FIG. 5 shows an embodiment of a switch element 400 that once again constitutes, together with a logic system (not depicted), a coupling element having a first channel 402, a second channel 404, a third channel 406, and a fourth channel 408. A normally-open switch 410 is disposed in first channel 402, a normally-closed switch 412 in second channel 404, a normally-open switch 414 in third channel 406, and a normally-closed switch 416 in fourth channel 408. A normally-open switch 418 is disposed in a channel 440 that combines first channel 402 and second channel 404, and a normally-closed switch 420 is disposed in a channel 442 that combines third channel 406 and fourth channel 408.

A first activation signal 430 activates normally-open switch 410 and normally-closed switch 412 together, a second activation signal 432 activates normally-open switch 414 and normally-closed switch 416 together, a third activation signal 434 activates normally-open switch 418 and normally-closed switch 420 together. This ensures that a load (not depicted) is always supplied with power via an output 444.

Reference is made once again to circuit assemblage 120 of FIG. 2 for an explanation of the coupling method. In said assemblage, two switches 124 and 126, and 134 and 136, are closed in order to power load 122.

A factor to consider is that in order to avoid toggling, the switches or switchover elements must not be activated too often. The voltage in a channel R would then fluctuate too often, and switching would have feedback effects on the redundant channels. This means that stress occurs with every switchover of the channel that is switched to. The voltage can collapse as a result, which in turn causes a switchover to the other channel. The voltage of the latter could likewise collapse due to the switchover, so that this intercoupling causes constant switchovers. This is intended to be avoided by the proposed method.

A fast and inherently reliable device for activating the aforementioned semiconductors in coupling element 72 in FIG. 1 is proposed for this purpose.

Provision is made in this context to combine self-locking and self-conducting power semiconductors in switch element 400 in such a way that a fail-safe state exists for a channel of the vehicle electrical system. The combined circuit arrangement of the activation logic system, with inverted effects on the two or four switches of the power supply channels, can continue to be provided. It is also possible to effect mutual hardware-based interlocking of the two power supply channels in order to prevent simultaneous switching of both channels. In addition, intelligent selection of the channel that is to be supplied with power can be ensured by a "fast-switching" analog logic system. Internal monitoring of that logic circuit can also be furnished so as to ensure a fail-safe state.

Toggling between two power supply channels can be eliminated by way of an integrated analog circuit. In the event of a fault, at least one of the two power supply channels can be furnished. The circuit configuration can furthermore prevent the two channels from coupling to one another in the event of a fault. It is thereby possible to ensure an efficient supply of power to the load, in particularly including operation at the working point.

The coupling method described in connection with FIGS. 3 to 5 has the advantage that load 70 in FIG. 1 continues to be supplied with power even in the event of failure of the control system of coupling element 72. The advantages of diodes are therefore transferred. At the same time, short circuits in load 70 can be actively disconnected.

The statements below now present embodiments of the circuit assemblage for carrying out a comparison, which assemblage can constitute, for example together with the switch elements shown in FIGS. 3 to 5, a coupling element. Other uses for the proposed circuit assemblages for carrying out a comparison, and for the method explained below for carrying out a comparison, are nevertheless also possible.

Figure 6:
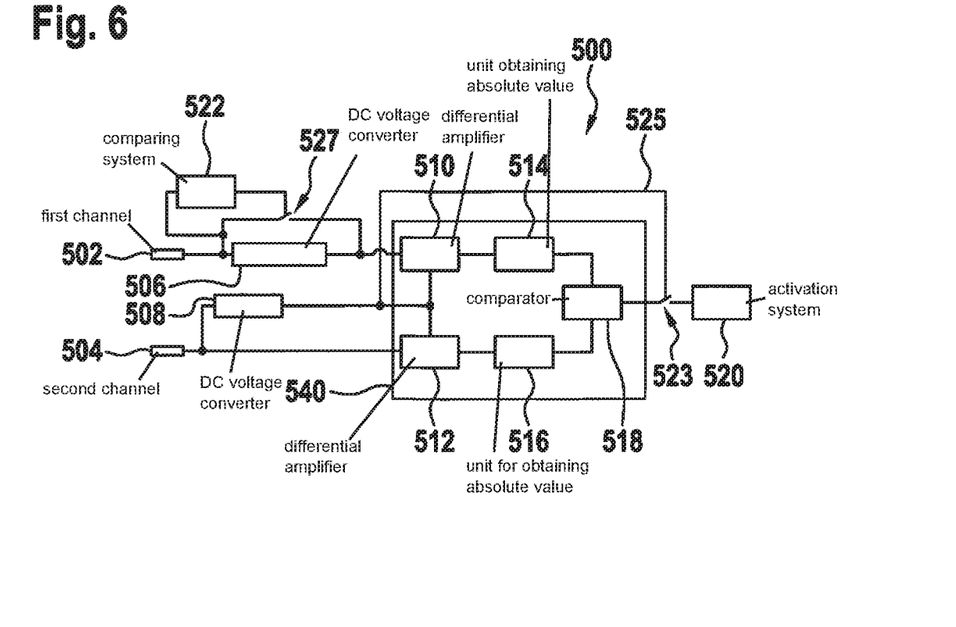
FIG. 6 is a block diagram showing a circuit assemblage for carrying out a comparison.

FIG. 6 is a block diagram showing a circuit assemblage 500 for carrying out a comparison, which arrangement can be used, for example, in the context of supplying power to safety-critical loads using a redundant vehicle electrical system topology made up of two channels with intelligent power supply channel selection in accordance with the proposed method. Circuit assemblage 500 that is shown is constructed exclusively using analog components. This corresponds to activation elements 210, 314, and 430, 432, 434.

The Figure shows a first channel 502, a second channel 504, a first DC voltage converter 506 that is also referred to herein as a "toggle" DC voltage converter, a second DC voltage converter 508 that is also referred to herein as a "reference" DC voltage converter, a first differential amplifier 510, a second differential amplifier 512, a first unit 514 for obtaining an absolute value, a second unit 516 for obtaining an absolute value, a comparator 518, and a comparing system 522. Circuit assemblage 500 has associated with it an activation system 520 having field effect transistors (FETs) for activating switches of a switch element as depicted, for example, in FIGS. 3 to 5.

FIG. 6 shows the underlying overall topology of circuit assemblage 500 for comparison, together with an activation system 520. This circuit assemblage 500, together with a switch element shown in FIGS. 3 to 5, constitutes a coupling element. Other possible uses for circuit assemblage 500 are, however, also possible. In one possible application, circuit assemblage 500 therefore ensures activation of switches for supplying power to safety-critical loads by way of a redundant vehicle electrical system topology made up of channel A or channel B, with intelligent power supply channel selection.

Two DC voltage converters 506, 508 are used in circuit assemblage 500, which represents a logic circuit. A DC voltage reference is needed in order to furnish a reference voltage of 13.5 V for the analog activation circuit. It is thereby possible to evaluate the voltage levels of the first channel and the second channel in the analog activation device 520, and determine the optimum power supply channel. To a first approximation, the optimum channel is the one that is closest to 13.5 V. A border labeled with the reference number 540 surrounds the circuit that is depicted in detail in FIG. 10.

The FETs are activated from comparator 518 which checks, with this comparison that is carried out, whether the absolute value of 514 or of 516 is greater. Activation system 520 of the FETs must adapt in this context to the components of FIG. 9. If the loads are to be supplied with power from first channel 502, comparator 518 must output a 0, since self-conducting FETs (550, 552 in FIG. 9), i.e. ones that conduct in the non-actuated state, are provided in first channel 502.

If the loads are to be supplied with power from second channel 504, the comparator must output a 1, since self-locking FETs (554, 556 in FIG. 9), i.e., ones that are interrupted in the non-actuated state, are provided in the second channel. The function of a switch 523 in FIG. 6 is to set the activation control signal 520 to 0 in the event of a failure of reference voltage converter 508, and thereby to switch to first channel 502. In other words, no activation occurs and first channel 502 is self-closing. A connection 525 therefore exists from DC voltage converter 508 to switch 523, and DC voltage converter 508 is also supplied with power from second channel 504. If second channel 504 fails, switch 523 at the end is opened, and the loads are always supplied with power from first channel 502.

The comparison circuit identified by border 540 encompasses two differential amplifiers 510, 512 that compare the input voltages of channels 502, 504 with the reference voltage. The latter is generated in reference DC voltage converter 508. Because the deviation can also be negative, the absolute value is then obtained respectively in 514 and 516. The channel having the smallest absolute deviation with respect to the reference voltage is then used to supply power to the safety-relevant loads.

For the case in which both first channel 502 and second channel 504 are close to one another, for example close to 13.5 V, voltage fluctuations that are always present in the vehicle electrical system would produce a constant, unnecessary "toggling" due to alternating activation of the switches. This toggling stresses the vehicle electrical system and its loads due to voltage fluctuations, and should therefore be avoided. Toggle DC voltage converter 506, which constitutes the input to differential amplifier 510, is introduced for this purpose. Because the output value of DC voltage converter 506 is equal to that of DC voltage converter 508, first channel 502 is always used to supply power to the safety-relevant loads. A switch 527 is closed by way of DC voltage converter 506 only if the voltage in first channel 502 deviates significantly. "Significantly" in this case means, for example, by more than 1 V.

Comparing system 522 has two inputs for this purpose, namely first channel 502 and a supply voltage (not depicted). It is only if the voltage of first channel 502 differs from the target value by an amount equal to a threshold value >x, for example 1 V, that a 1 is outputted by comparing system 522, and switch 527 is therefore closed.

Figure 7:
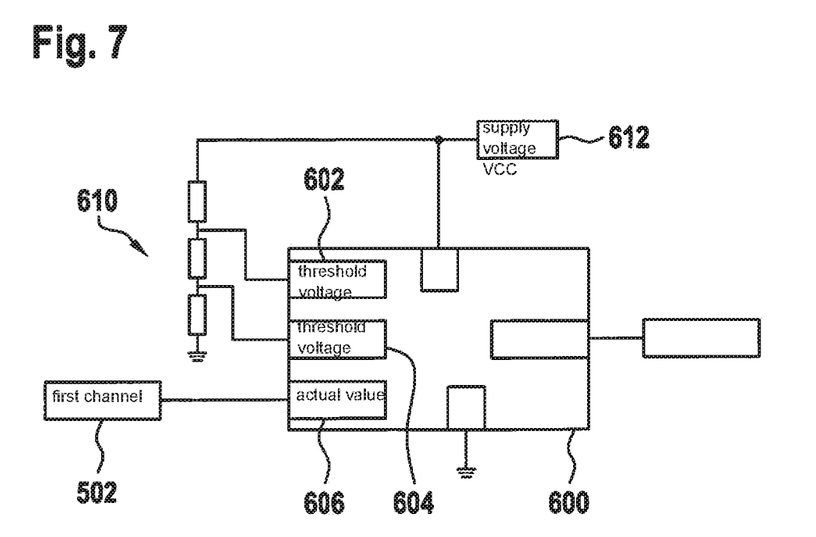
FIG. 7 is a block diagram of an embodiment of a comparing system.

FIG. 7 shows a possible configuration of the comparing system (reference number 522 in FIG. 6), which is labeled here with the reference number 600. Note that comparing system 522 also contains voltage divider 610, i.e., the inputs of comparing system 522 are, strictly speaking, 612 and 502. Comparing system 600 is a comparator module having three inputs 602, 604, 606, i.e. two threshold voltages (inputs 602 and 604) and first channel 502 at third input 606. The thresholds at comparing system 600, here e.g. 12.5 V and 14.5 V, are set by way of a respective voltage divider 610 tapped from supply voltage VCC 612 of the comparator. The comparator of comparing system 600 thus has three inputs, namely a lower threshold at 602, upper threshold at 604, and actual value at 606. If the voltage level of first channel 502 is within this range, the switch (reference number 527 in FIG. 6) after comparing system 600 (reference number 522 in FIG. 6) is open. This means that the first channel supplies power to DC voltage converter 506 in FIG. 6. Because DC voltage converter 506 provides, for example, exactly 13.5 V, which conforms to the voltage of reference DC voltage converter 508, the comparator circuit of comparing system 600 enables first channel 502 to supply power. A supply of power to the comparator should be ensured in suitable fashion. One possibility for this is that the comparator of comparing system 600 has the same positive supply voltage as output comparator 518 of FIG. 6. Alternatively, power can be supplied from an external component having a corresponding ASIL classification.

Figure 8:
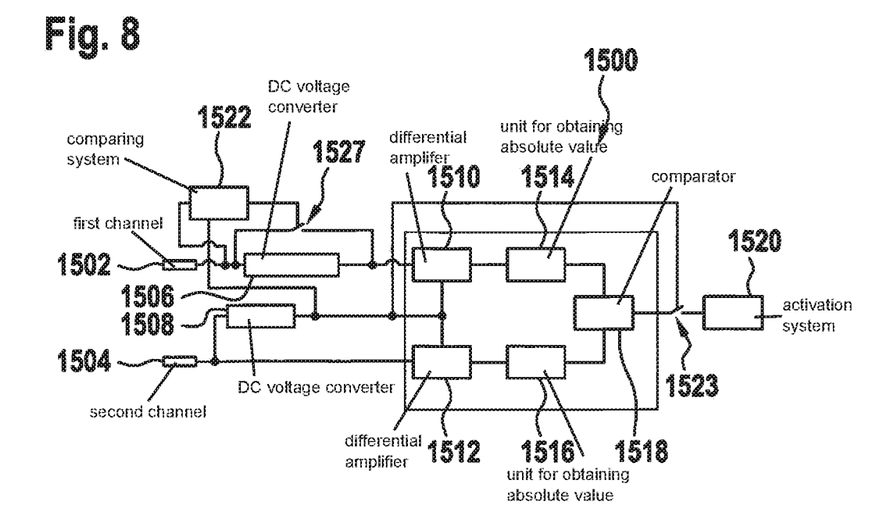
FIG. 8 is a block diagram of an alternative circuit assemblage for carrying out a comparison.

FIG. 8 shows an embodiment of the circuit assemblage that is an alternative to FIG. 6 and is labeled in its entirety with the reference number 1500. The Figure shows a first channel 1502, a second channel 1504, a first DC voltage converter 1506, a second DC voltage converter 1508, a first differential amplifier 1510, a second differential amplifier 1512, a first unit 1514 for obtaining an absolute value, a second unit 1516 for obtaining an absolute value, a comparator 1518, and a comparing system 1522. Circuit assemblage 1500 has associated with it an activation system 1520 having field effect transistors (FETs) for activating switches of a switch element, as depicted e.g. in FIGS. 3 to 5. A first switch 1523 and a second switch 1527 are also shown.

As compared with the embodiment in FIG. 6, comparing system 1522 is connected to first channel 502 and to reference DC voltage converter 1508. In this case, a check is made as to whether the absolute value of (U_first channel 1502 −U_reference voltage) is, for example <1 V, i.e., whether the output voltage of first channel 1502 is close to the reference value. This is again done with the same objective: if U_first channel 1502 is close to the reference value, e.g. 13.5 V, then in order to prevent toggling, switch 1527 will be opened and the output voltage of DC voltage converter 1506 will therefore go into differential amplifier 1510. The internal configuration of comparing system 1522 then differs from the configuration shown in FIG. 7.

Figure 9:
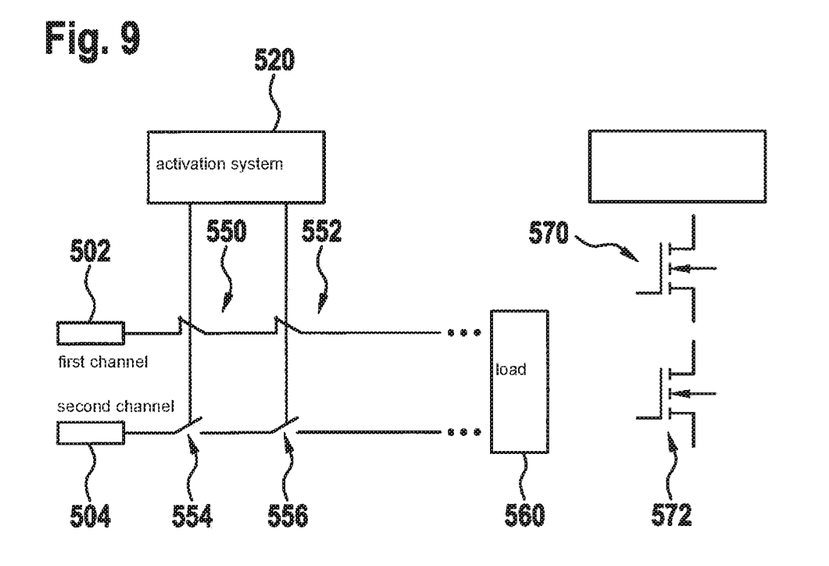
FIG. 9 shows the use of self-conducting and self-locking FETs.

FIG. 9 shows the use of self-conducting and self-locking FETs. The Figure shows, on the left side, activation system 520 of FIG. 6 having first channel 502 and second channel 504 as well as a first self-conducting FET 550, a second self-conducting FET 552, a first self-locking FET 554, a second self-locking FET 556, and a load 560. For illustration, the circuit symbol of a self-conducting FET 570 and a self-locking FET 572 is reproduced on the right side.

Figure 10:
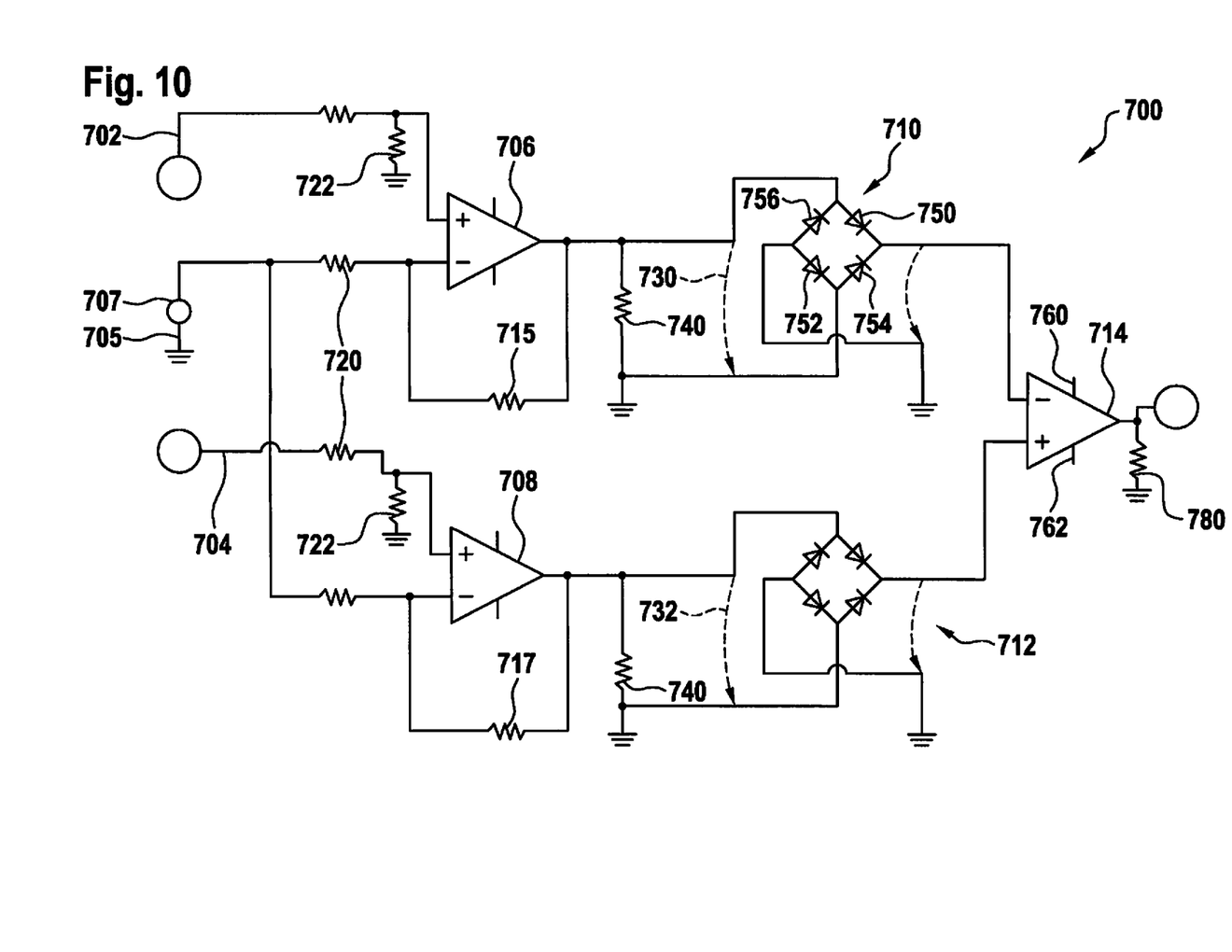
FIG. 10 is a circuit diagram showing an analog circuit for carrying out a comparison.

FIG. 10 depicts an embodiment of an analog activation device, labeled in its entirety with the reference number 700, which implements a circuit assemblage in accordance with FIG. 6. The Figure shows a first channel 702, a second channel 704, and an input 705 for a reference voltage that is furnished by a voltage source 707. Also provided are a first differential amplifier 706, a second differential amplifier 708 that is embodied as an operational amplifier, and a first unit 710 for obtaining an absolute value and a second unit 712 for obtaining an absolute value, which are each embodied as a diode rectifier. A comparator 714 is located at the output. Voltage source 707 lies within the voltage range in which the components are to be supplied with power, preferably at the center of the range.

The function of resistors R1 720 and R2 722 is to limit the input current in circuit assemblage 700 and thus to avoid stress on the vehicle electrical system. The values are typically in the range of 100 kilohm. Differential amplifiers 706 and 708 each determine the difference between the respective input voltage and the reference voltage. The output voltage is Ux 730 and Uy 732. Resistors R3 740 also have the function of limiting the currents that flow. The values are in the range of 100 kilohm. The design depends on the comparator 714 that is used. Resistors R4 715 and 717 are in the range of 100 kilohm, and serve to limit the input current.

The function of diode rectifiers 710, 712 is to mathematically obtain the absolute value. If the voltage Ux 730 is positive, current flows via D1 750 and D3 752. If Ux 730 is negative, current flows via D2 754 and D4 756. The respective other diodes block. Because of the high resistance values, however, what flows in terms of energy is not appreciable currents but rather "signals."

The function of comparator 714 is to generate the activation signal for the power semiconductors. For that purpose, the supply voltage, which is typically furnished by an independent external unit, is applied to upper terminal 760, and lower terminal 762 is at ground. If Ux 730 is less than Uy 732, the output becomes conductive. If Ux 730 is greater than Uy 732, the output is equal to zero. A resistor R5 780 causes the voltage drop, which is measured as high or low. This is not obligatorily necessary, and depends in particular on the final circuit. Values are in the range from 10 to 100 kilohm.

Activation device 520 of FIG. 6 is designed to be fail-safe, so that a supply of power from one channel can be furnished in every instance. In the event of a fault in the second channel, a supply of power from the first channel is ensured because of the self-conducting semiconductor components of FIG. 7. In the event of a fault in the second channel, a supply of power from the second channel is ensured by way of circuit assemblage 700 of FIG. 10 and by way of a switching element. The principle is that the first channel furnishes power to first DC voltage converter 506, and the second channel furnishes power to reference voltage DC voltage converter 508.

In detail, this means that in the event of a failure of the DC voltage converter of the first channel, by way of the circuit of FIG. 8 the comparator permits activation of the FETs from the second channel. The second channel thus supplies power to the loads. In the event of a failure of DC voltage converter 508 of the second channel, a supply of power from the first channel is effected by way of the circuit of FIG. 10.

A further advantage of the activation device is that it avoids constant or "toggling" switchover of the power supply channels. A hysteresis circuit, which compares the voltage level of first channel 502 on the basis of defined threshold values, has been implemented for this purpose in analog fashion. The values selected are, by way of example:

if: ($U$ref<12.5 V)$v$($U$ref>14.5 V)->then: close switch 527

If the voltage level of first channel 502 is beyond this value range, first DC voltage converter 506 of the first channel is bypassed by closing switch 527 (see FIG. 9). The consequence of this is that the circuit assemblage of FIG. 8 checks whether the voltage level of the first channel or of the second channel is closer to the reference value (13.5 V). Depending on the voltage situation, the first channel or the second channel supplies power to the loads. An intelligent selection of the power supply channel is thereby ensured.

If the voltage level of first channel 502 is within this range, the risk of toggling exists. This problem is solved by first DC voltage converter 506 from the first channel A, which constantly furnishes the same voltage as the DC voltage reference, e.g. 13.5 V. The downstream differential amplifier circuit in the course of the first channel consequently supplies a zero voltage. A supply of power to the loads from the first channel is therefore prioritized, since the first channel is closer to the reference voltage (U CH-A=U REF). Comparator evaluation system 518 does not produce any activation, and first channel A therefore supplies power to the loads.

This embodiment has the advantage that a failure of reference voltage DC voltage converter 508 of FIG. 6 is queried and, in the event of doubt, switches the prioritized fault-free first channel, since the latter is embodied with self-conducting FETs. A further advantage is that a failure of DC voltage converter 508 in an over- or undervoltage situation is queried by a comparison (comparing system 522) in accordance with FIG. 6, and in the event of doubt switches the prioritized fault-free first channel.

If DC voltage converter 508 fails, there is then an elevated probability that a fault exists in the second channel, since DC voltage converter 508 is supplied with power from the second channel. The result of the comparison (comparing system 522) is thus to the bypass switch of first DC voltage converter 506 and ensure a supply of power from the first channel.

FIG. 9 shows the load path to the (safety-critical) loads. The first channel contains two self-conducting (NC) power semiconductors (e.g. n-type IG-FETs). The second channel, conversely, contains two self-locking (NO) power semiconductors (e.g. n-type MOSFETs). Both are switched by the same "FET activation" activation signal proceeding from the intelligent analog circuit of FIG. 10. This ensures that only one channel at a time supplies power to the loads; hardware-based mutual interlocking is also ensured. If the activation signal=zero/false, the prioritized first channel then supplies power to the loads. If the activation signal=one/true, the prioritized second channel then supplies power to the loads.

FIG. 10 depicts the analog activation circuit for two-channel powering of safety-relevant loads. It ensures an intelligent selection of the power supply channel. The use of operational amplifiers (op-amps) for measured signal processing offers several advantages. These include:

- negligibly little influence on the circuit being measured;
- no input quiescent currents: for bipolar op-amps these are from 10 nA to a few 100 nA; for FET input stages the values almost approach 0 A;
- reaction time is extremely fast (analog circuit technology).

Provision is made in this context that based on a preset reference voltage value, e.g. 13.5 V, of a low-power DC/DC converter, the intention is to select the power supply channel whose voltage level exhibits the least difference from the reference voltage value, for example 13.5 V.

The embodiment has the advantage that a failure of the DC/DC ref in a context of over- or undervoltage is queried by a comparison (V) in accordance with FIG. 6, and in the event of doubt the prioritized fault-free first channel is switched.

The intelligent channel selection is based on the fact that in a context of two possible power supply channels, the one that is closer to a defined reference value (DC voltage reference) is selected. To ascertain this, firstly the respective voltage difference between the first channel and the DC voltage reference, and between the second channel and the DC voltage reference, must be obtained by way of a differential amplifier.

The result produced by the differential amplifier can be both positive and negative, and the absolute value of the signal must therefore firstly be obtained; only then can the evaluation by way of a comparator be performed. If the absolute value were not obtained, the negative voltage would always be lower than the positive voltage.

Example without obtaining absolute value (FIG. 10):

First channel CH-A=12 V and second channel CH-B=14.5 V;

After differential amplifier:

$$Ux=U_{CH-A}-U_{ref}=12\text{ V}-13.5\text{ V}=-1.5\text{ V}$$

$$Uy=U_{CH-B}-U_{ref}=14.5\text{ V}-13.5\text{ V}=1\text{ V}$$

If the comparator evaluation were performed now, Uy would be greater than Ux, and Ux (therefore the first channel) would supply power to the loads; but that would be incorrect. If the absolute values of Ux and Uy are obtained, the result of the comparator would be |Ux|>|Uy|, and Uy (therefore the second channel B) would supply power to the loads; this is correct, since this voltage is closer to the DC voltage reference value.

In the context of intelligent channel selection, firstly the deviation of the individual channel voltages from the reference voltage must be ascertained by way of a differential amplifier:

$$U_{CH-A}-U_{REF}=UX,\text{ and }U_{CH-B}-U_{REF}=Uy.$$

For further processing, the absolute values of |Ux| and |Uy| are obtained by way of a diode circuit. The use of diodes has the advantage of low cost. It is then possible as a result to select, by way of a comparator circuit, the channel that is closer to the required reference voltage. The output signal of the comparator controls the self-conducting and self-locking FETs in the load path of the first channel and of the second channel.

A possible evaluation by the comparator could be as follows:

Comparator logic $$|Ux|>|Uy|=0\text{ (activation OFF)}$$

$$|Ux|<|Uy|=1\text{ (activation ON).}$$

Simultaneous switching of both channels can be avoided by hardware-based mutual interlocking.

Utilization in a context of power supply from three or four channels is also possible (see FIG. 5).

What is claimed is:

1. A circuit assemblage for carrying out a comparison between a first signal and a second signal in consideration of a reference signal, the circuit assemblage comprising:
    a first channel in which the first signal is processed, and a second channel in which the second signal is processed, a first differential amplifier, which obtains a first difference between the first signal and the reference signal, and a first unit for obtaining an absolute value, which obtains a first absolute value from the first difference, being provided in the first channel, and a second differential amplifier, which obtains a second difference between the second signal and the reference signal, and a second unit for obtaining an absolute value, which obtains a second absolute value from the second difference, being provided in the second channel;
    a comparator that compares the first absolute value with the second absolute value; and
    a coupling element through which a redundant voltage supply is supplied from the first channel or the second channel to a safety-relevant component.

2. The circuit assemblage as recited in claim 1, which is embodied to output, as a function of the comparison carried out by the comparator, an activation signal for a switch element.

3. The circuit assemblage as recited in claim 1, wherein the first unit for obtaining an absolute value and the second for obtaining an absolute value are each constituted by a diode rectifier.

4. The circuit assemblage as recited in claim 1, further comprising:
    a reference DC voltage converter for outputting the reference voltage.

5. The circuit assemblage as recited in claim 1, further comprising:
    after the comparator, a switch that determines a preferred signal.

6. The circuit assemblage as recited in claim 1, which has associated with it an external, independent voltage source for furnishing a supply of power for the comparator.

7. The circuit assemblage as recited in claim 1, wherein the circuit assemblage is deployed in a motor vehicle that includes the safety-relevant component and a non-safety-relevant component.

8. A circuit assemblage for carrying out a comparison between a first signal and a second signal in consideration of a reference signal, the circuit assemblage comprising:

a first channel in which the first signal is processed, and a second channel in which the second signal is processed, a first differential amplifier, which obtains a first difference between the first signal and the reference signal, and a first unit for obtaining an absolute value, which obtains a first absolute value from the first difference, being provided in the first channel, and a second differential amplifier, which obtains a second difference between the second signal and the reference signal, and a second unit for obtaining an absolute value, which obtains a second absolute value from the second difference, being provided in the second channel;

a comparator that compares the first absolute value with the second absolute value; and a toggle DC voltage converter.

9. A circuit assemblage for carrying out a comparison between a first signal and a second signal in consideration of a reference signal, the circuit assemblage comprising:

a first channel in which the first signal is processed, and a second channel in which the second signal is processed, a first differential amplifier, which obtains a first difference between the first signal and the reference signal, and a first unit for obtaining an absolute value, which obtains a first absolute value from the first difference, being provided in the first channel, and a second differential amplifier, which obtains a second difference between the second signal and the reference signal, and a second unit for obtaining an absolute value, which obtains a second absolute value from the second difference, being provided in the second channel;

a comparator that compares the first absolute value with the second absolute value; and a comparing system configured to activate a switch to bypass a toggle DC voltage converter.

10. A method for carrying out a comparison between a first signal and a second signal in consideration of a reference signal, comprising:

processing the first signal in a first channel and processing the second signal in a second channel;

in the first channel, obtaining, by a first differential amplifier, a first difference between the first signal and the reference signal, and obtaining, by unit for obtaining an absolute value obtains, a first absolute value from the first difference;

in the second channel, obtaining, by a second differential amplifier, a second difference between the second signal and the reference signal, and obtaining, by a unit for obtaining an absolute value, a second absolute value from the second difference;

comparing, by a comparator, the first absolute value with the second absolute value; and operating a coupling element through which a redundant voltage supply is supplied from the first channel or the second channel to a safety-relevant component.

11. The method as recited in claim 10, further comprising:

activating a switch element as a function of the comparison carried out by the comparator.

12. The method as recited in claim 10, wherein one of the two signals is determined as a preferred signal.

13. The method as recited in claim 10, wherein the method is carried out in a motor vehicle that includes the safety-relevant component and a non-safety-relevant component.

* * * * *